(12) United States Patent
Itagaki (10) Patent No.: US 7,545,653 B2
(45) Date of Patent: Jun. 9, 2009

(54) SEMICONDUCTOR INTEGRATED CIRCUIT DEVICE

(75) Inventor: Takatoshi Itagaki, Hokkaido (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 11/673,669

(22) Filed: Feb. 12, 2007

(65) Prior Publication Data

US 2007/0188369 A1    Aug. 16, 2007

(30) Foreign Application Priority Data

Feb. 14, 2006   (JP)   ............................. 2006-037053
Feb. 7, 2007    (JP)   ............................. 2007-027930

(51) Int. Cl.
*H05K 7/00*   (2006.01)

(52) U.S. Cl. ..................... 361/820; 361/58; 257/620; 257/734

(58) Field of Classification Search ................. 361/820, 361/58; 257/202–204, 336, 355–356, 394, 257/619–620, 734, E21, E23, E27
See application file for complete search history.

(56) References Cited

U.S. PATENT DOCUMENTS

| | | | | | |
|---|---|---|---|---|---|
| 3,996,537 | A | * | 12/1976 | Neuman | ...................... 333/177 |
| 4,185,325 | A | * | 1/1980  | Appel | .......................... 708/320 |
| 4,637,843 | A | * | 1/1987  | Takayama et al. | .............. 420/73 |
| 4,672,584 | A | * | 6/1987  | Tsuji et al. | ................... 365/226 |
| 4,741,023 | A | * | 4/1988  | Lawson | .................. 379/106.01 |
| 4,788,653 | A | * | 11/1988 | Henderson et al. | ........... 708/300 |
| 4,922,367 | A | * | 5/1990  | Hidaka | ........................... 361/58 |
| 5,226,319 | A | * | 7/1993  | Suzuki | ...................... 73/204.14 |
| 5,278,105 | A | * | 1/1994  | Eden et al. | .................... 438/129 |
| 5,463,245 | A | * | 10/1995 | Hiruta | ......................... 257/620 |
| 5,594,383 | A | * | 1/1997  | Tamba | ......................... 327/552 |
| 5,664,022 | A | * | 9/1997  | Fiori, Jr. | ..................... 381/94.1 |
| 5,670,816 | A | * | 9/1997  | Hatano et al. | ................ 257/394 |
| 5,673,196 | A | * | 9/1997  | Hoffman et al. | ............... 702/65 |
| 5,770,880 | A | * | 6/1998  | Woodbury et al. | ........... 257/336 |
| 5,854,995 | A | * | 12/1998 | Plis et al. | ....................... 702/72 |
| 5,923,273 | A | * | 7/1999  | Pastorello | ..................... 341/77 |
| 5,978,741 | A | * | 11/1999 | Elmore et al. | ................. 702/60 |
| 5,994,741 | A | * | 11/1999 | Koizumi et al. | ............. 257/355 |
| 6,023,717 | A | * | 2/2000  | Argyroudis | ................. 708/300 |

(Continued)

FOREIGN PATENT DOCUMENTS

JP    2001-174534    6/2001

(Continued)

*Primary Examiner*—Dean A. Reichard
*Assistant Examiner*—Xiaoliang Chen
(74) *Attorney, Agent, or Firm*—Ladas & Parry LLP (57) ABSTRACT

A disclosed semiconductor integrated circuit device includes a digital circuit and an analog circuit formed on one semiconductor substrate; a guard band configured to prevent noise generated in the digital circuit from being transmitted to the analog circuit; a first power supply terminal configured to supply a power-supply voltage to the analog circuit; a first ground terminal configured to supply a ground potential to the analog circuit; a second power supply terminal configured to supply the power-supply voltage to the digital circuit; a second ground terminal configured to supply the ground potential to the digital circuit; and a filter circuit positioned between the second power supply terminal, the second ground terminal, and the digital circuit and configured to remove the noise transmitted from the digital circuit.

6 Claims, 12 Drawing Sheets

U.S. PATENT DOCUMENTS

| | | | | |
|---|---|---|---|---|
| 6,034,575 | A * | 3/2000 | Watanabe | 333/81 A |
| 6,060,752 | A * | 5/2000 | Williams | 257/355 |
| 6,376,909 | B1 * | 4/2002 | Forbes et al. | 257/734 |
| 6,483,749 | B1 * | 11/2002 | Choi et al. | 365/185.18 |
| 6,509,854 | B1 * | 1/2003 | Morita et al. | 341/144 |
| 6,941,258 | B2 * | 9/2005 | Van Heijningen et al. | 703/16 |
| 2001/0029601 | A1 * | 10/2001 | Kimura et al. | 716/19 |
| 2002/0012405 | A1 * | 1/2002 | Lee et al. | 375/300 |
| 2002/0022951 | A1 * | 2/2002 | Heijningen et al. | 703/16 |
| 2002/0047942 | A1 * | 4/2002 | Vorenkamp et al. | 348/731 |
| 2002/0063267 | A1 * | 5/2002 | Kumagai et al. | 257/202 |
| 2002/0163689 | A1 * | 11/2002 | Matsushita et al. | 359/124 |
| 2002/0164851 | A1 * | 11/2002 | Wu et al. | 438/215 |
| 2004/0008270 | A1 * | 1/2004 | Hisamatsu et al. | 348/257 |
| 2004/0104732 | A1 * | 6/2004 | Oosawa et al. | 324/613 |
| 2004/0189388 | A1 * | 9/2004 | Nguyen et al. | 330/254 |
| 2004/0219898 | A1 * | 11/2004 | Bult et al. | 455/252.1 |
| 2004/0233718 | A1 * | 11/2004 | Yaoi et al. | 365/185.11 |
| 2005/0064834 | A1 * | 3/2005 | Bilgic | 455/234.2 |
| 2005/0081076 | A1 * | 4/2005 | Okuda | 713/600 |
| 2005/0161810 | A1 * | 7/2005 | Sakura et al. | 257/734 |
| 2006/0261451 | A1 * | 11/2006 | Nakatsu et al. | 257/673 |
| 2007/0120244 | A1 * | 5/2007 | Kojima et al. | 257/691 |
| 2007/0184790 | A1 * | 8/2007 | Gilberton et al. | 455/127.1 |

FOREIGN PATENT DOCUMENTS

JP  2002246553 A * 8/2002

* cited by examiner

SEMICONDUCTOR INTEGRATED CIRCUIT DEVICE

BACKGROUND OF THE INVENTION

1. Field of the Invention

The present invention generally relates to a semiconductor integrated circuit device, and more particularly relates to a semiconductor integrated circuit device including a digital circuit and an analog circuit.

2. Description of the Related Art

Currently, lithium ion batteries are commonly used in portable devices such as digital cameras. One problem in using a lithium ion battery is that it is generally difficult to measure the remaining battery power based on its voltage. For this reason, the remaining battery power of a lithium ion battery is calculated, for example, by measuring and totaling the amounts of charge-and-discharge currents of the lithium ion battery with, for example, a microprocessor (patent document 1).

For example, fuel gauge ICs are used for measuring remaining battery power as described above. A fuel gauge IC includes, for example, analog circuits such as a high-resolution A/D converter and digital circuits such as a CPU for totaling the measured amounts of currents and a timer and is provided as a one-chip semiconductor integrated circuit device.

In the digital circuits, noise associated with, for example, charge-and-discharge currents, through currents, and harmonic components is generated in synchronization with clock signals. The noise generated in the digital circuits is transmitted within the one-chip semiconductor integrated circuit device to the analog circuits and, for example, reduces the resolution of A/D conversion.

Meanwhile, along with the downsizing of battery packs, fuel gauge ICs have also become smaller. Downsizing fuel gauge ICs increases the influence of noise and makes it difficult to provide a circuit or an electronic part used for noise reduction as an internal component. This is a problem not only for fuel gauge ICs, but also for any semiconductor integrated circuit device including an analog circuit and a digital circuit.

[Patent document 1] Japanese Patent Application Publication No. 2001-174534

For the above reason, in a conventional semiconductor integrated circuit device including both an analog circuit and a digital circuit, an external component is normally used for noise protection.

SUMMARY OF THE INVENTION

The present invention provides a semiconductor integrated circuit device that substantially obviates one or more problems caused by the limitations and disadvantages of the related art.

Embodiments of the present invention provide a semiconductor integrated circuit device in which noise protection is performed without using an external component.

An embodiment of the present invention provides a semiconductor integrated circuit device including a digital circuit and an analog circuit formed on one semiconductor substrate; a guard band formed on the semiconductor substrate in a position between the digital circuit and the analog circuit and configured to prevent noise generated in the digital circuit from being transmitted to the analog circuit; a first power supply terminal positioned on a periphery of the semiconductor substrate near the analog circuit and configured to supply a power-supply voltage to the analog circuit; a first ground terminal positioned on the periphery of the semiconductor substrate near the analog circuit and configured to supply a ground potential to the analog circuit; a second power supply terminal positioned on the periphery of the semiconductor substrate near the digital circuit and configured to supply the power-supply voltage to the digital circuit; a second ground terminal positioned on the periphery of the semiconductor substrate near the digital circuit and configured to supply the ground potential to the digital circuit; and a filter circuit positioned between the second power supply terminal, the second ground terminal, and the digital circuit and configured to remove the noise transmitted from the digital circuit.

Another embodiment of the present invention provides a semiconductor integrated circuit device including a digital circuit and an analog circuit formed on one semiconductor substrate; a guard band formed on the semiconductor substrate in a position between the digital circuit and the analog circuit and configured to prevent noise generated in the digital circuit from being transmitted to the analog circuit; a power supply terminal positioned on a periphery of the semiconductor substrate near the digital circuit and configured to supply a power-supply voltage to the digital circuit; a ground terminal positioned on the periphery of the semiconductor substrate near the digital circuit and configured to supply a ground potential to the digital circuit; a filter circuit positioned between the power supply terminal, the ground terminal, and the digital circuit and configured to remove the noise transmitted from the digital circuit; a branched power supply line that branches off from a power supply line connecting the power supply terminal and the filter circuit and is configured to supply the power-supply voltage to the analog circuit; and a branched ground line that branches off from a ground line connecting the ground terminal and the filter circuit and is configured to supply the ground potential to the analog circuit.

DESCRIPTION OF THE PREFERRED EMBODIMENTS

Preferred embodiments of the present invention are described below with reference to the accompanying drawings.

[Configuration of Fuel Gauge IC According to an Embodiment]

Figure 1:
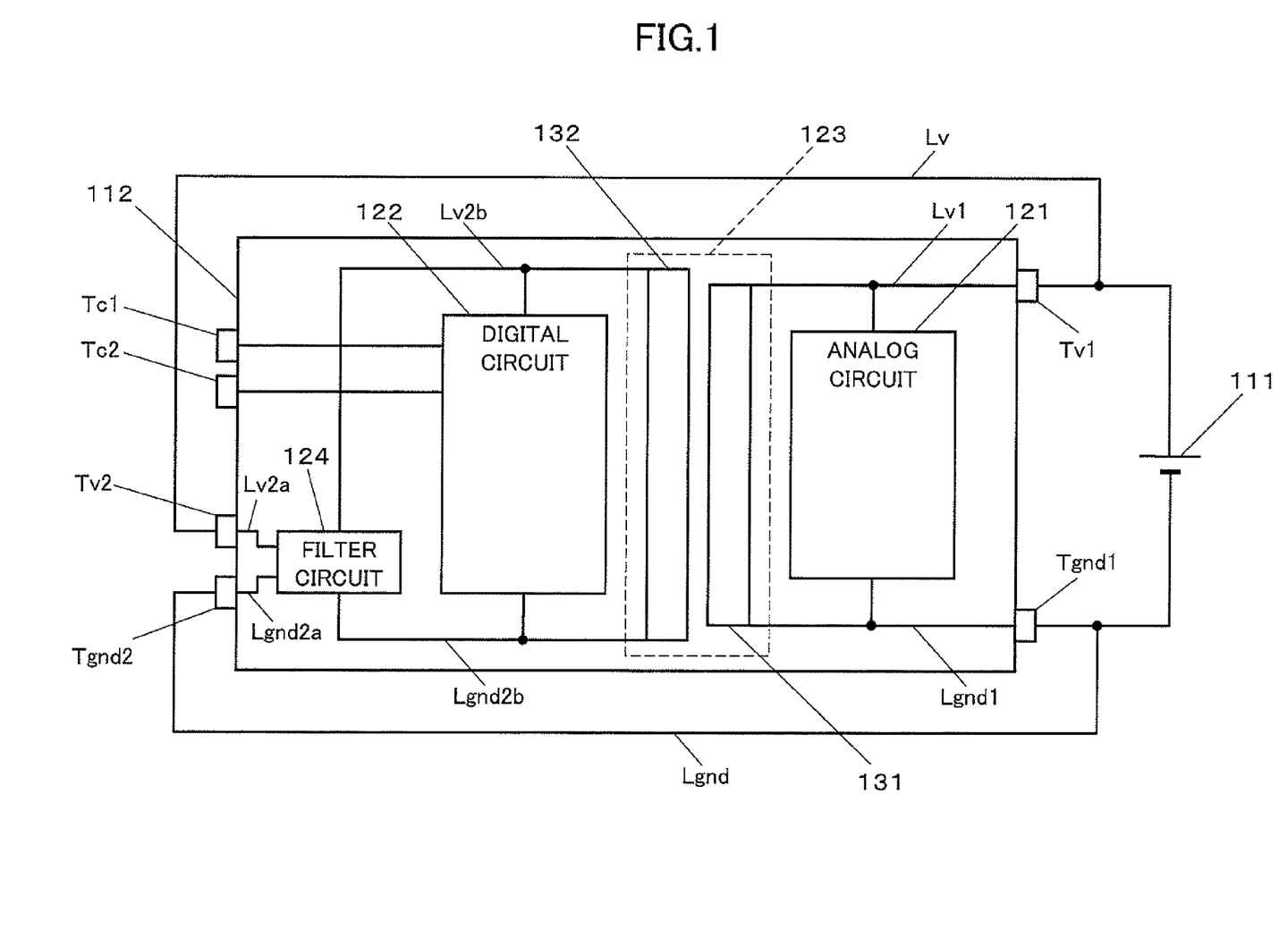
FIG. 1 is a block diagram illustrating an exemplary configuration of a fuel gauge IC provided as an example of a semiconductor integrated circuit device according to an embodiment of the present invention.

FIG. 1 is a block diagram illustrating an exemplary configuration of a fuel gauge IC provided as an example of a semiconductor integrated circuit device according to an embodiment of the present invention.

A fuel gauge IC 112 is formed on a single semiconductor substrate and includes an analog circuit 121, a digital circuit 122, a guard band 123, and a filter circuit 124. Along the periphery of the semiconductor substrate where the fuel gauge IC 112 is formed, a power supply terminal Tv1 and a ground terminal Tgnd1 for the analog circuit 121, a power supply terminal Tv2 and a ground terminal Tgnd2 for the digital circuit 122, and communication terminals Tc1 and Tc2 are provided.

The analog circuit 121 and the digital circuit 122 are placed apart from each other in the fuel gauge IC 112. The power supply terminal Tv1 is positioned near the analog circuit 121, as far away as possible from the digital circuit 122, and is connected to the positive terminal of a battery 111. The ground terminal Tgnd1 is positioned near the analog circuit 121, as far away as possible from the digital circuit 122, and is connected to the negative terminal of the battery 111.

The power supply terminal Tv2 is positioned near the digital circuit 122, as far away as possible from the analog circuit 121, and is connected to the positive terminal of the battery 111 via a power supply line Lv provided outside of the fuel gauge IC 112. The ground terminal Tgnd2 is positioned near the digital circuit 122, as far away as possible from the analog circuit 121, and is connected to the negative terminal of the battery 111 via a ground line Lgnd provided outside of the fuel gauge IC 112.

Examples of the analog circuit 121 include a sigma-delta modulation circuit for analog-to-digital conversion and a drive circuit. The analog circuit 121 is connected via an internal power supply line Lv1 and an internal ground line Lgnd1 to the power supply terminal Tv1 and the ground terminal Tgnd1, respectively, and is driven by an electric current supplied from the battery 111.

The digital circuit 122 is, for example, a digital signal processing circuit and is connected to the power supply terminal Tv2 and the ground terminal Tgnd2 via an internal power supply line Lv2$b$, an internal ground line Lgnd2$b$, the filter circuit 124, an internal power supply line Lv2$a$, and an internal ground line Lgnd2$a$. The digital circuit 122 is driven by an electric current supplied from the battery 111 and, for example, processes digital data supplied from the analog circuit 121 in synchronization with a 4 MHz clock signal.

[Configuration of Guard Band]

Figure 2:
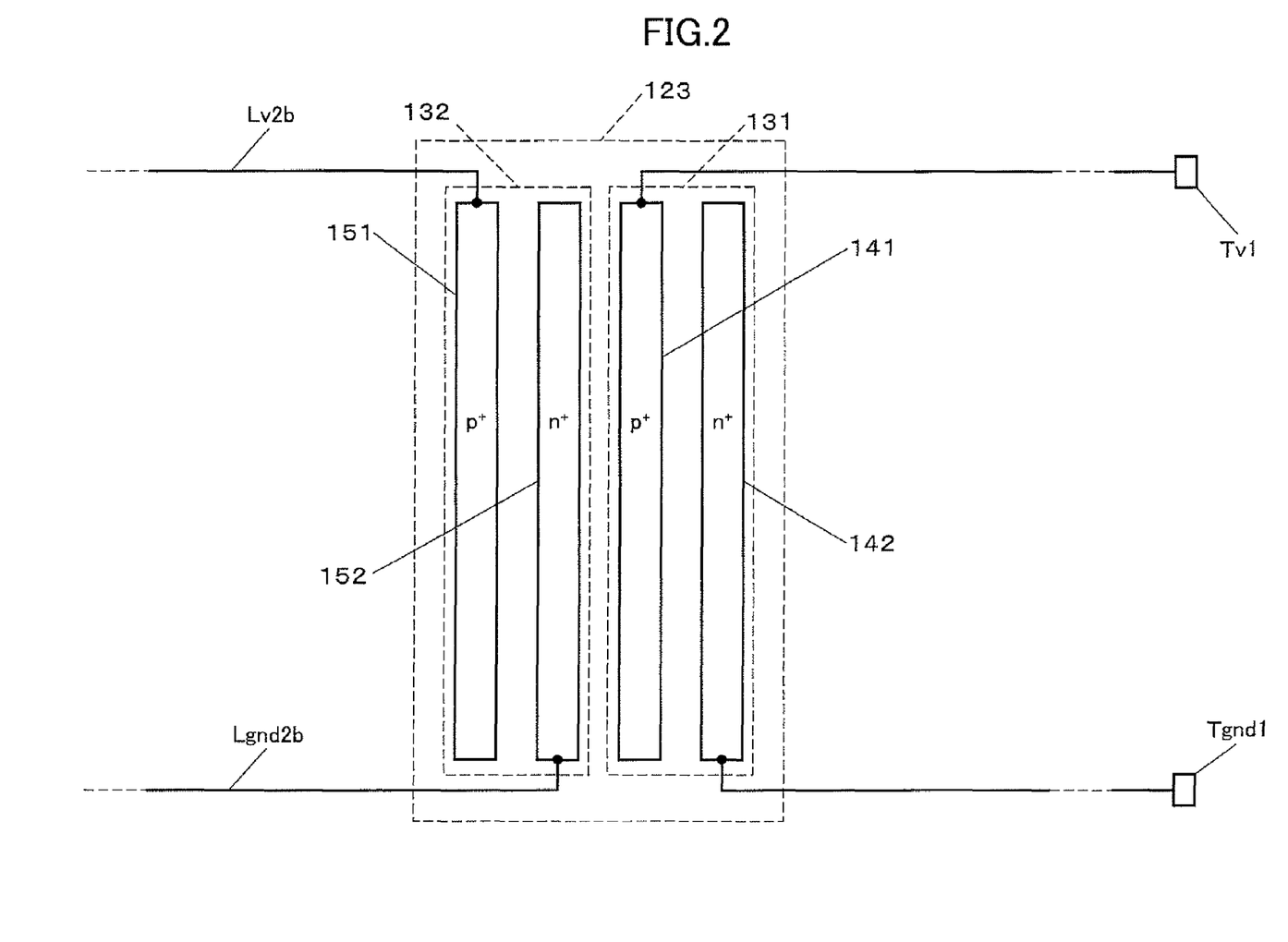
FIG. 2 is a plan view of an exemplary guard band.
Figure 3:
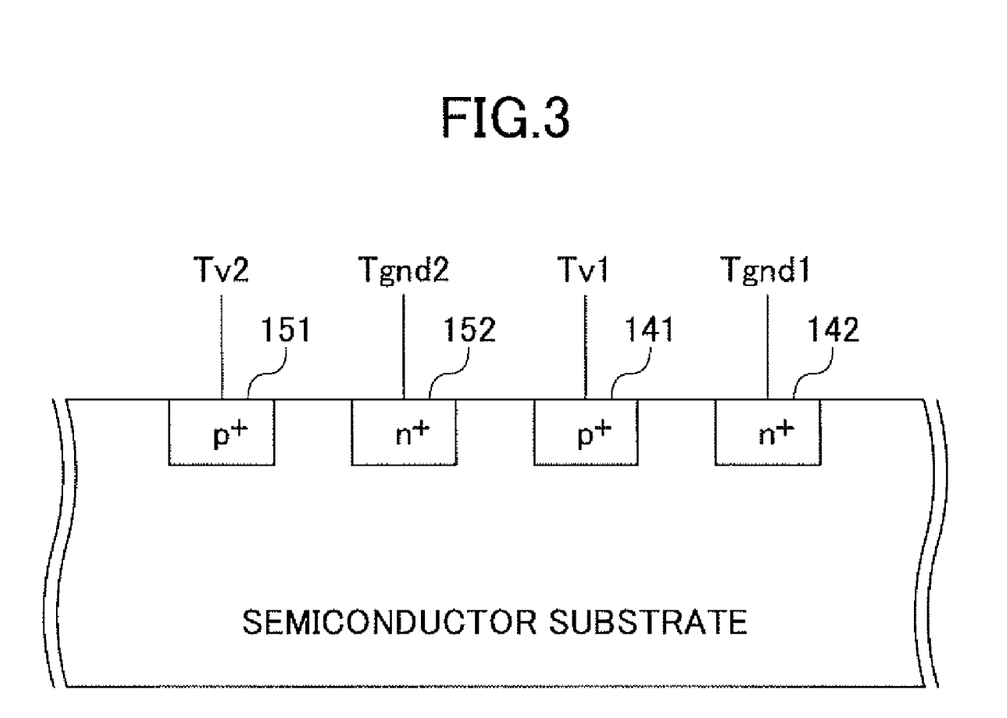
FIG. 3 is a cut-away side view of the exemplary guard band.

FIG. 2 is a plan view of a guard band 123 and FIG. 3 is a cut-away side view of the guard band 123.

The guard band 123 is positioned between the analog circuit 121 and the digital circuit 122 and includes an analog-circuit-side guard band 131 and a digital-circuit-side guard band 132.

The analog-circuit-side guard band 131 is positioned closer to the analog circuit 123 than is the digital-circuit-side guard band 132 and includes substrate contacts 141 and 142. The substrate contact 141, which is implemented as a high concentration impurity diffusion region p$^+$, is positioned closer to the digital circuit 122 than is the substrate contact 142 and connected to the power supply terminal Tv1. The substrate contact 142, which is implemented as a high concentration impurity diffusion region n$^+$, is positioned closer to the analog circuit 121 than is the substrate contact 141 and connected to the ground terminal Tgnd1.

The digital-circuit-side guard band 132 is positioned closer to the digital circuit 122 than is the analog-circuit-side guard band 131 and includes substrate contacts 151 and 152. The substrate contact 151, which is implemented as a high concentration impurity diffusion region p$^+$, is positioned closer to the digital circuit 122 than is the substrate contact 152 and connected to the internal power supply terminal Lv2$b$. The substrate contact 152, which is implemented as a high concentration impurity diffusion region n$^+$, is positioned closer to the analog circuit 121 than is the substrate contact 151 and connected to the internal ground terminal Lgnd2$b$.

Noise generated in the digital circuit 122 is attenuated by the substrate contact 151 or 152 of the digital-circuit-side guard band 132 or the substrate contact 141 or 142 of the analog-circuit-side guard band 131 and is thereby prevented from being transmitted to the analog circuit 121.

The analog-circuit-side guard band 131 may be configured to include only one of the substrate contacts 141 and 142, and the digital-circuit-side guard band 132 may be configured to include only one of the substrate contacts 151 and 152.

[Configuration of Filter Circuit]

Figure 4:
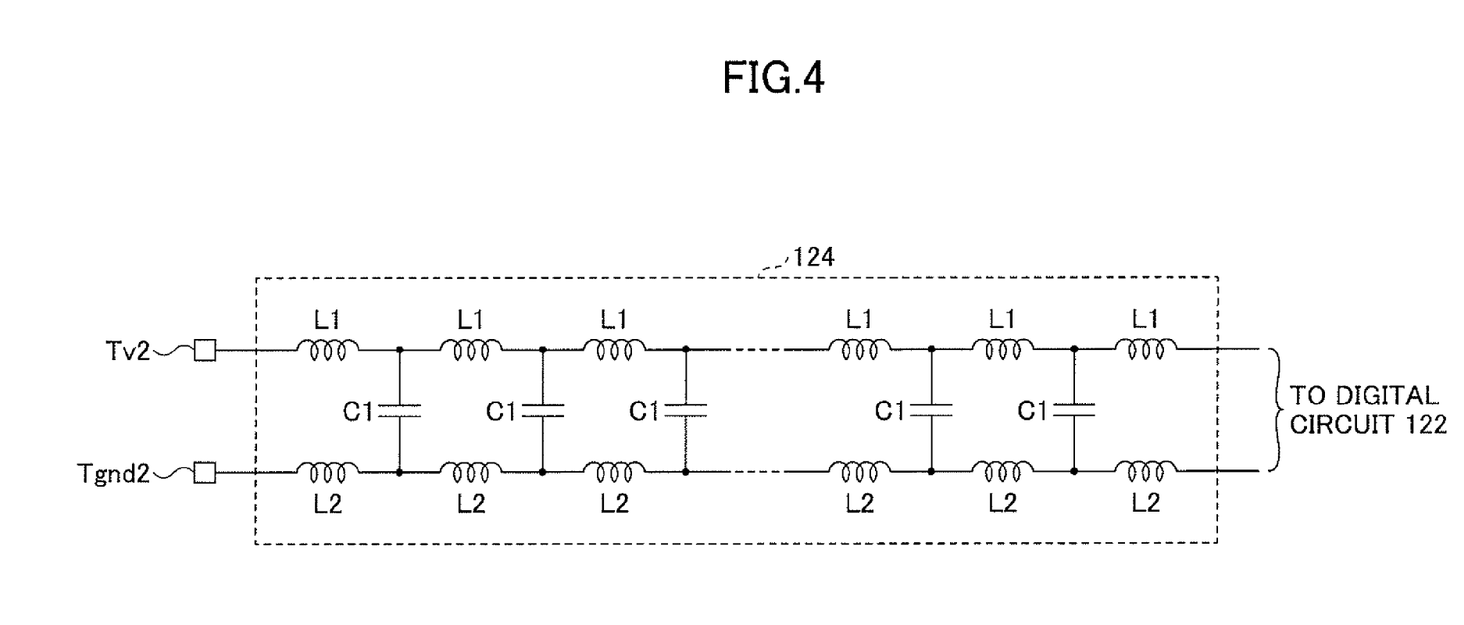
FIG. 4 is an equivalent circuit schematic of an exemplary filter circuit.
Figure 5:
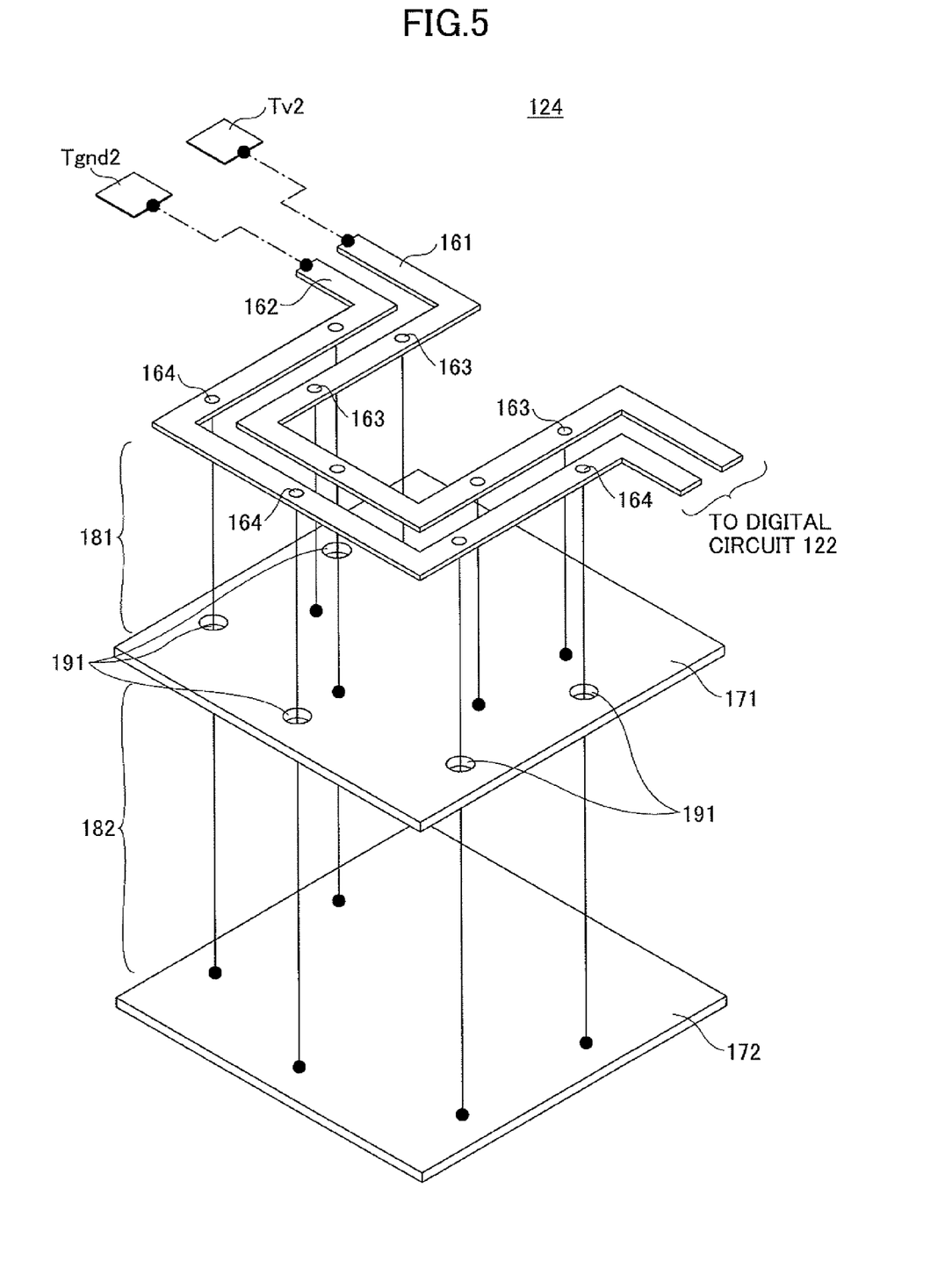
FIG. 5 is an exploded perspective view of the exemplary filter circuit.
Figure 6:
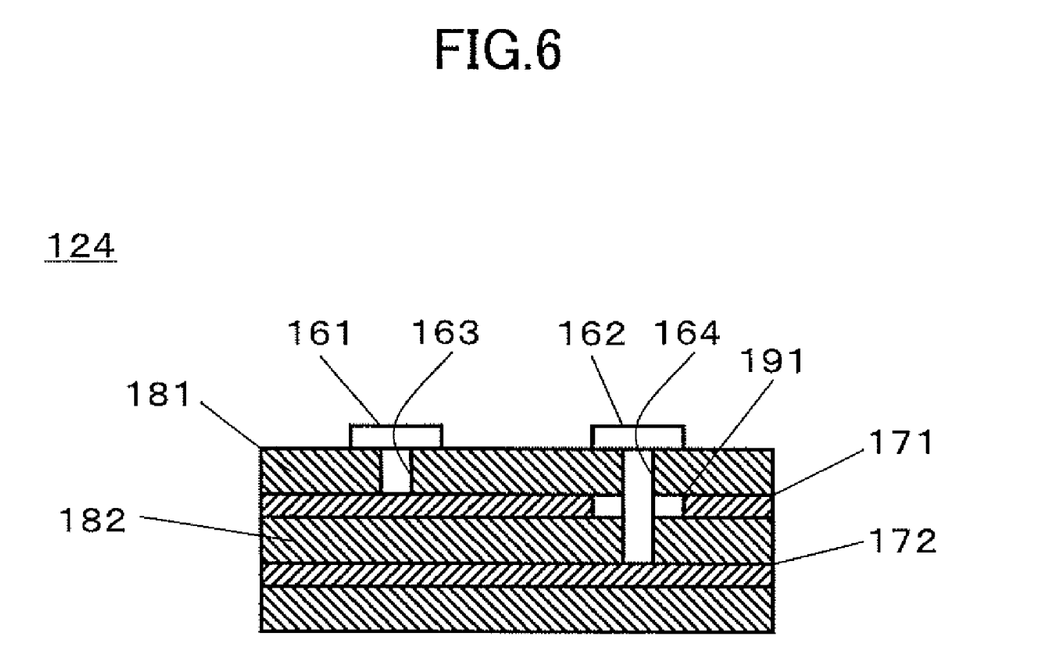
FIG. 6 is a cut-away side view of the exemplary filter circuit.

FIG. 4 is an equivalent circuit schematic of the filter circuit 124, FIG. 5 is an exploded perspective view of the filter circuit 124, and FIG. 6 is a cut-away side view of the filter circuit 124.

The filter circuit 124 is positioned away from the analog circuit 121, near the digital circuit 122, and adjacent to the power supply terminal Tv2 and the ground terminal Tgnd2.

As shown in FIG. 4, the filter circuit 124 is a low-pass filter including inductors L1 connected in series, inductors L2 connected in series, and capacitors C1 connected between the inductors L1 and the inductors L2. The circuit constant of the filter circuit 124 is determined so that the filter circuit 124 blocks a 4 MHz clock frequency and its harmonic component.

As shown in FIG. 5, the inductors L1 are implemented as a U-shaped (square-wave-shaped or crenelated) wiring pattern 161 and the inductors L2 are implemented as a U-shaped (square-wave-shaped or crenelated) wiring pattern 162. The wiring patterns 161 and 162 are arranged in parallel with each other.

The inductance of the inductors L1 and L2 can be adjusted by changing the distance between the wiring patterns 161 and 162 and the lengths of the wiring patterns 161 and 162. In this embodiment, the wiring patterns 161 and 162 are U-shaped (square-wave-shaped or crenelated). However, the wiring patterns 161 and 162 may be formed in any shape as long as desired inductance is obtained.

As shown in FIGS. 5 and 6, the capacitors C1 are implemented as a first conductive pattern 171 and a second conductive pattern 172 that are provided as separate layers below the wiring layer where the wiring patterns 161 and 162 are formed. The first and second conductive patterns 171 and 172 are stacked with an insulating layer 182 provided between them.

The first conductive pattern 171 is, for example, shaped like a flat rectangular plate and is positioned below the wiring patterns 161 and 162 with an insulating layer 181 between them. The first conductive pattern 171 is connected to the wiring pattern 161 via through holes 163. The through holes 163 are provided, for example, at several µm intervals in the length direction of the wiring pattern 161. With this configuration, the electric potential on the surface of the first conductive pattern 171 becomes substantially the same as that of the wiring pattern 161.

The second conductive pattern 172 is, for example, shaped like a flat rectangular plate and is positioned below the first conductive pattern 171 with an insulating layer 182 between them. The second conductive pattern 172 is connected to the wiring pattern 162 via through holes 164 that contactlessly pass through insulated holes 191 formed in the first conductive pattern 171. The through holes 164 are formed, for example, at several μm intervals in the length direction of the wiring pattern 162. With this configuration, the electric potential on the surface of the second conductive pattern 172 becomes substantially the same as that of the wiring pattern 162.

Thus, the filter circuit 124 including the wiring patterns 161 and 162 with the capacitors C1 connected between them is formed. The capacitance of the capacitors C1 can be adjusted by changing the sizes of the first conductive pattern 171 and the second conductive pattern 172, the distance between them, the thickness of the insulating layer 182, and/or the dielectric constant of the insulating layer 182.

In this embodiment, the filter circuit 124 and the guard band 123 are provided in a semiconductor integrated circuit device having the analog circuit 121 and the digital circuit 122. The filter circuit 124 removes noise transmitted to the power supply terminal Tv2 and the ground terminal Tgnd2. The guard band 123 is provided between the digital circuit 122 and the analog circuit 121 and blocks noise from the digital circuit 122 to the analog circuit 121. Thus, such a configuration makes it possible to block noise without using an external component.

[Other Configurations of Filter Circuit]

Figure 7:
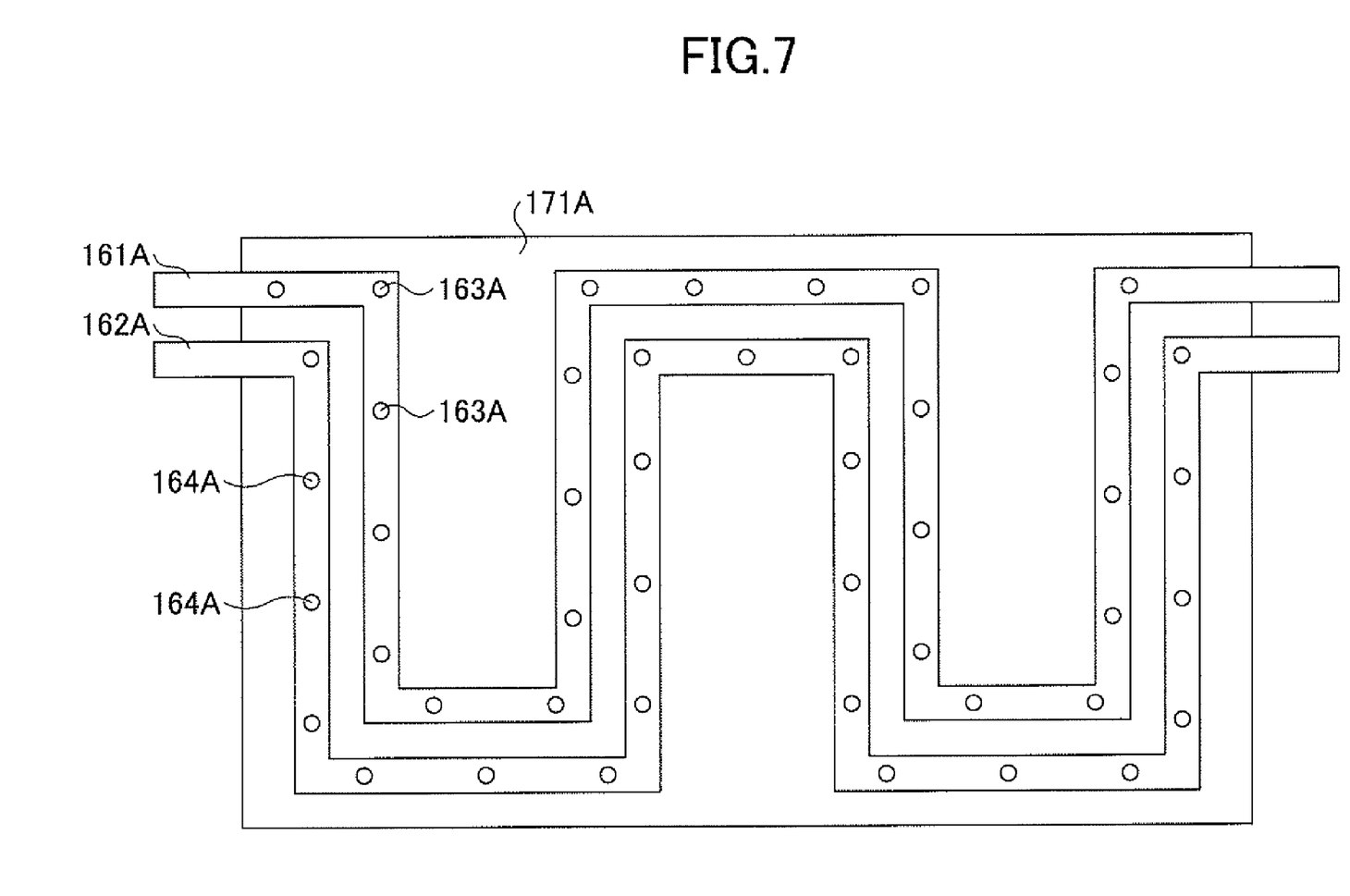
FIG. 7 is a plan view of another exemplary filter circuit.
Figure 8:
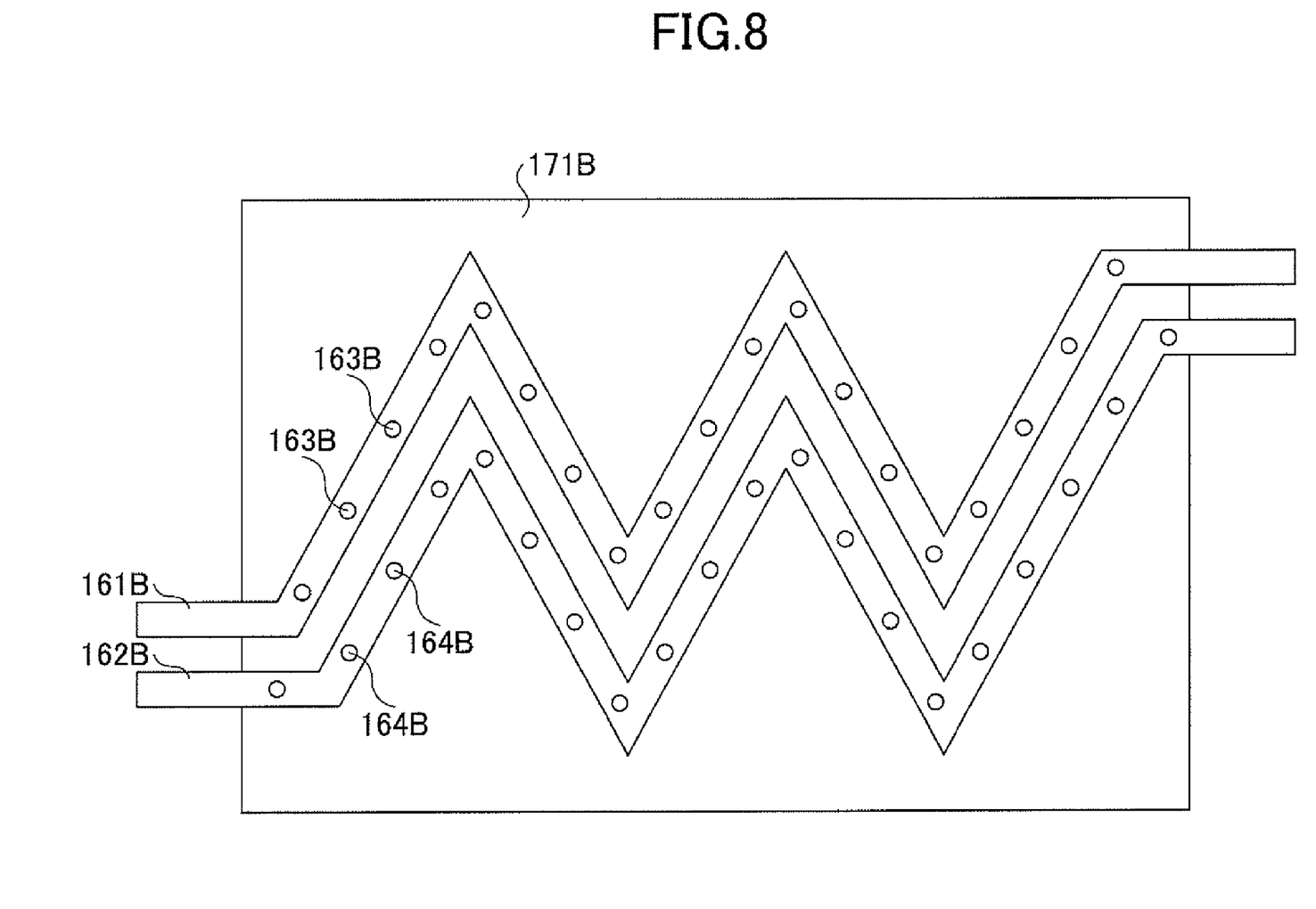
FIG. 8 is a plan view of another exemplary filter circuit.
Figure 9:
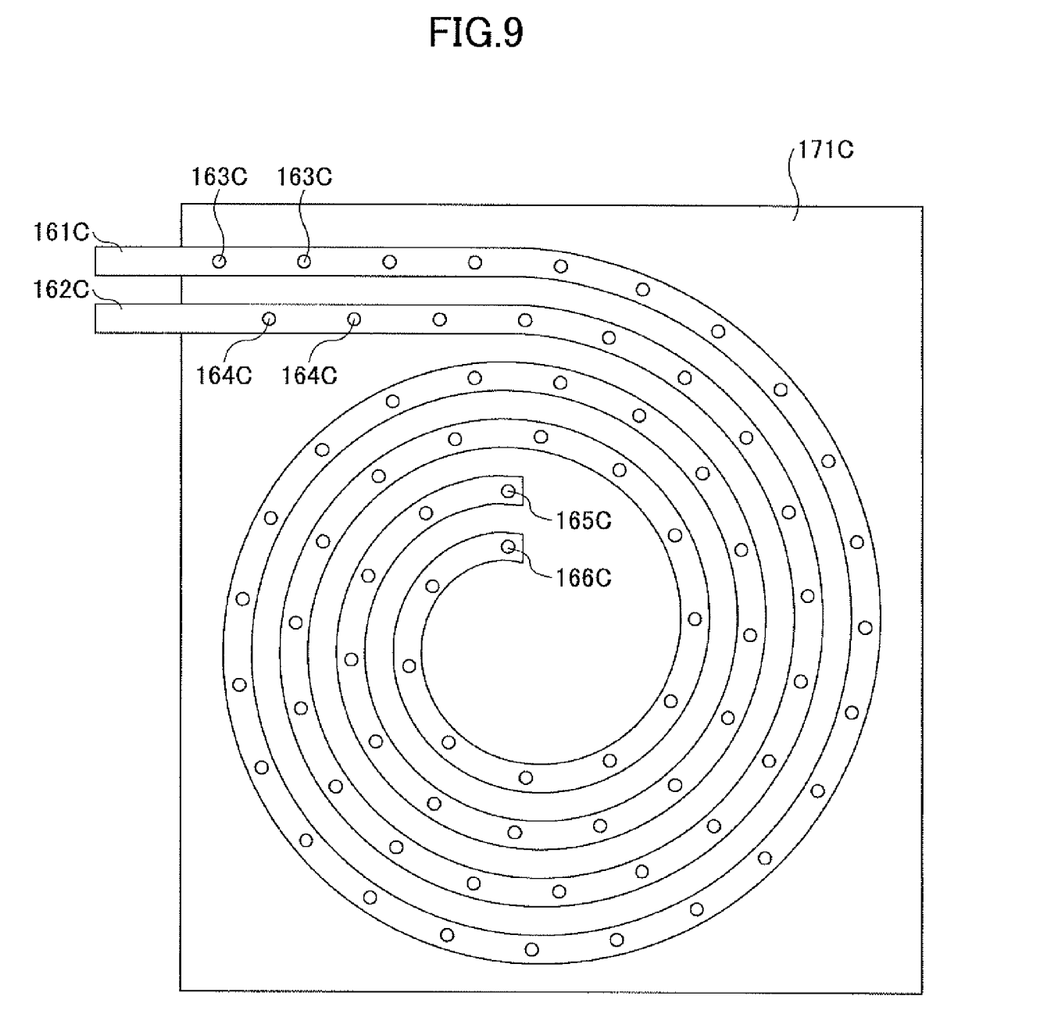
FIG. 9 is a plan view of another exemplary filter circuit.

FIGS. 7 through 9 are plan views of variations of the filter circuit 124.

In a variation of the filter circuit 124 shown in FIG. 7, the inductors L1 connected in series are implemented as a square-wave-shaped (crenelated) wiring pattern 161A and the inductors L2 connected in series are implemented as a square-wave-shaped (crenelated) wiring pattern 162A. The wiring patterns 161A and 162A are arranged in parallel with each other. The capacitors C1 are implemented as a first conductive pattern 171A and a second conductive pattern (not shown) that are shaped like flat rectangular plates. The first conductive pattern 171A and the second conductive pattern and provided as separate layers and stacked below the wiring layer where the wiring patterns 161 and 162 are formed. The first conductive pattern 171A is connected to the wiring pattern 161A via through holes 163A. The second conductive pattern is connected to the wiring pattern 162A via through holes 164A that contactlessly pass through insulated holes formed in the first conductive pattern 171A.

In another variation of the filter circuit 124 shown in FIG. 8, the inductors L1 connected in series are implemented as a triangular-wave-shaped wiring pattern 161B and the inductors L2 connected in series are implemented as a triangular-wave-shaped wiring pattern 162B. The wiring patterns 161B and 162B are arranged in parallel with each other. The capacitors C1 are implemented as a first conductive pattern 171B and a second conductive pattern (not shown) that are shaped like flat rectangular plates. The first conductive pattern 171B and the second conductive pattern are provided as separate layers and stacked below the wiring layer where the wiring patterns 161A and 162B are formed. The first conductive pattern 171B is connected to the wiring pattern 161B via through holes 163B. The second conductive pattern is connected to the wiring pattern 162B via through holes 164B that contactlessly pass through insulated holes formed in the first conductive pattern 171B.

In still another variation of the filter circuit 124 shown in FIG. 9, the inductors L1 connected in series are implemented as a spiral-shaped wiring pattern 161C and the inductors L2 connected in series are implemented as a spiral-shaped wiring pattern 162C. The wiring patterns 161C and 162C are arranged in parallel with each other. The capacitors C1 are implemented as a first conductive pattern 171C and a second conductive pattern (not shown) that are shaped like flat rectangular plates. The first conductive pattern 171C and the second conductive pattern are provided as separate layers and stacked below a first wiring layer where the wiring patterns 161C and 162C are formed. The first conductive pattern 171C is connected to the wiring pattern 161C via through holes 163C. The second conductive pattern is connected to the wiring pattern 162C via through holes 164C that contactlessly pass through insulated holes formed in the first conductive pattern 171C.

The ends of the wiring patterns 161C and 162C in the center of the spiral are connected, respectively, via through holes 165C and 166C to a conductive pattern (not shown) formed on a second wiring layer above the first wiring layer and further connected via the conductive pattern on the second wiring layer to the digital circuit 122.

In the filter circuit 124 shown in FIG. 5, 7, or 8, the two wiring patterns may be formed separately on a first wiring layer and a second wiring layer.

[Configuration of Fuel Gauge IC According to Another Embodiment]

Figure 10:
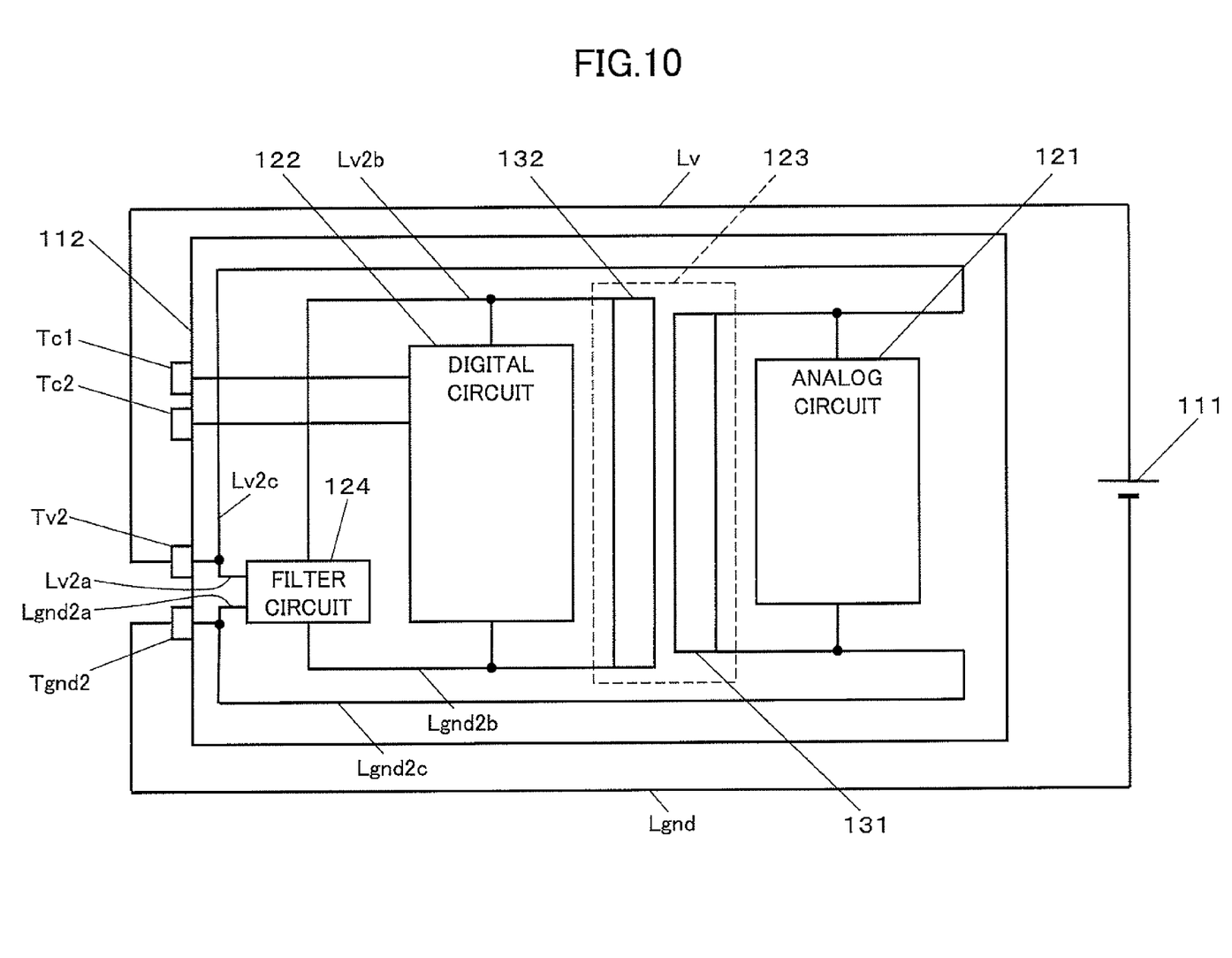
FIG. 10 is a block diagram illustrating an exemplary configuration of a fuel gauge IC provided as an example of a semiconductor integrated circuit device according to another embodiment of the present invention.

FIG. 10 is a block diagram illustrating an exemplary configuration of a fuel gauge IC provided as an example of a semiconductor integrated circuit device according to another embodiment of the present invention. The fuel gauge IC 112 shown in FIG. 10 is different from that shown in FIG. 1 in that the power supply terminal Tv1 and the ground terminal Tgnd1 for the analog circuit 121 are removed.

As shown in FIG. 10, the power supply terminal Tv2 is connected to the positive terminal of the battery 111 via the power supply line Lv provided outside of the fuel gauge IC 112, and the ground terminal Tgnd2 is connected to the negative terminal of the battery 111 via the ground line Lgnd provided outside of the fuel gauge IC 112.

The digital circuit 122 is connected to and supplied with an electric current from the power supply terminal Tv2 and the ground terminal Tgnd2 via the internal power supply line tv2b, the internal ground line Lgnd2b, the filter circuit 124, the internal power supply line Lv2a, and the internal ground line Lgnd2a. A branched internal power supply line Lv2c and a branched internal ground line Lgnd2c branch off from the internal power supply line Lv2a and the internal ground line Lgnd2a, respectively. The branched internal power supply line Lv2c and the branched internal ground line Lgnd2c are connected to and supply an electric current to the analog circuit 121.

The substrate contact 141 (see FIG. 2) of the analog-circuit-side guard band 131 is connected to the branched internal power supply line Lv2c and the substrate contact 142 is connected to the branched internal ground line Lgnd2c. The substrate contact 151 of the digital-circuit-side guard band 132 is connected to the internal power supply line Lv2b and the substrate contact 152 is connected to the internal ground line Lgnd2b.

Thus, this embodiment makes it possible to remove the power supply terminal Tv1 and the ground terminal Tgnd1 from the fuel gauge IC 112.

[Battery Pack]

Figure 11:
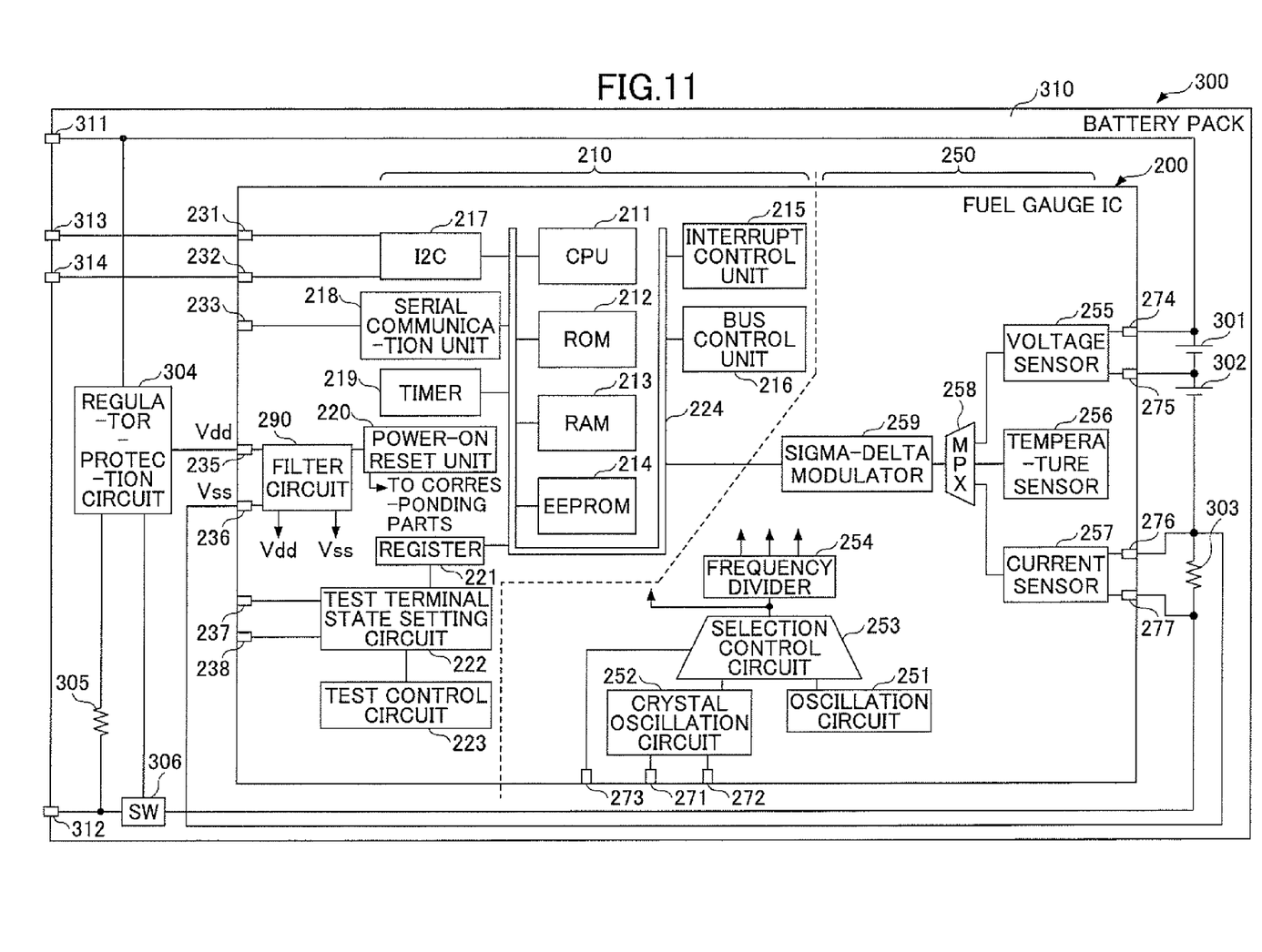
FIG. 11 is a block diagram illustrating an exemplary configuration of an exemplary battery pack according to an embodiment of the present invention.

FIG. 11 is a block diagram illustrating an exemplary configuration of an exemplary battery pack including a fuel gauge IC according to an embodiment of the present invention. In FIG. 11, a fuel gauge IC 200 is implemented as a semiconductor integrated circuit device and includes a digital unit 210, an analog unit 250, and a filter circuit 290.

The digital unit 210 corresponds to the digital circuit 122 shown in FIG. 1, the analog unit 250 corresponds to the analog circuit 121 shown in FIG. 1, and the filter circuit 290 corresponds to the filter circuit 124 shown in FIG. 1. A guard band 123 (not shown) is provided in a position indicated by a broken line in FIG. 11.

The digital unit 210 includes a CPU 211, a ROM 212, a RAM 213, an EEPROM 214, an interrupt control unit 215, a bus control unit 216, an I2C unit 217, a serial communication unit 218, a timer 219, a power-on reset unit 220, a register 221, a test terminal state setting circuit 222, and a test control circuit 223. The CPU 211, the ROM 212, the RAM 213, the EEPROM 214, the interrupt control unit 215, the bus control unit 216, the I2C unit 217, the serial communication unit 218, the timer 219, and the register 221 are interconnected by an internal bus 224.

The CPU 211, for example, executes a program stored in the ROM 212 and thereby controls the fuel gauge IC 200 and also obtains the remaining battery power of a battery by totaling the amounts of charge-and-discharge currents of the battery. The RAM 213 is used as a work area for this processing. The EEPROM 214 stores, for example, trimming information.

The interrupt control unit 215 receives interrupt requests from other parts in the fuel gauge IC 200, generates interrupt signals according to the priorities of the interrupt requests, and sends the interrupt signals to the CPU 211. The bus control unit 216 assigns the internal bus 224 to each circuit.

The I2C unit 217 is connected via ports 231 and 232 to a clock line L1 and a data line L2 (see FIG. 12) and performs two-wire serial communication. The serial communication unit 218 is connected via port 233 to a communication line (not shown) and performs single-wire serial communication.

The timer 219 counts system clock pulses. The system clock count is referred to by the CPU 211. The power-on reset unit 220 detects a rise of a power-supply voltage Vdd supplied to a port 235 connected to the power-on reset unit 220 via the filter circuit 290, generates a reset signal, and sends the reset signal to corresponding parts in the fuel gauge IC 200.

The register 221 retains information transferred from the EEPROM 214. The test terminal state setting circuit 222 connects test terminals 237 and 238 and the test control circuit 223 according to the information retained in the register 221 and sets the levels of inputs from the test terminals 237 and 238 to predetermined values.

When receiving the inputs from the test terminals 237 and 238, the test control circuit 223 changes the states of internal circuits in the fuel gauge IC 200 according to the inputs to perform tests on the internal circuits.

The analog unit 250 includes an oscillation circuit 251, a crystal oscillation circuit 252, a selection control circuit 253, a frequency divider 254, a voltage sensor 255, a temperature sensor 256, a current sensor 257, a multiplexer 258, and a sigma-delta modulator 259.

The oscillation circuit 251 is an oscillator having a PLL and outputs an oscillation signal with a frequency of several MHz. The crystal oscillation circuit 252 has an external crystal oscillator connected to ports 271 and 272 and outputs an oscillation signal with a frequency of several MHz. The oscillation frequency of the crystal oscillation circuit 252 is higher than that of the oscillation circuit 251.

The selection control circuit 253 selects either one of oscillation signals output from the oscillation circuit 251 and the crystal oscillation circuit 252 according to a selection signal supplied from a port 273 and supplies the selected oscillation signal as a system clock signal to the frequency divider 254 and other corresponding parts in the fuel gauge IC 200. The selection control circuit 253 also generates a reset signal RST and a control signal CNT. The selection control circuit 253 may be configured to select an oscillation signal from the oscillation circuit 251 when no selection signal is supplied from the port 273. The frequency divider 254 divides the frequency of the system clock signal, thereby generates various clock signals, and supplies the generated clock signals to corresponding parts in the fuel gauge IC 200.

The voltage sensor 255 detects voltages of external batteries 301 and 302 connected to ports 274 and 275 and supplies the detected voltages as a voltage analog signal to the multiplexer 258. The temperature sensor 256 detects an environmental temperature of the fuel gauge IC 200 and supplies the detected temperature as a temperature analog signal to the multiplexer 258.

Ports 276 and 277 are connected to corresponding ends of a resistor 303 used for electric current detection. The current sensor detects an electric current passing through the resistor 303 based on the potential difference between the ports 276 and 277 and supplies the detected electric current as a current analog signal to the multiplexer 258.

In this embodiment, the port 274 corresponds to the power supply terminal Tv1 for the analog circuit 121 shown in FIG. 1 and the port 276 corresponds to the ground terminal Tgnd1 for the analog circuit 121 shown in FIG. 1.

The multiplexer 258 selects and supplies the voltage analog signal, the temperature analog signal, and the current analog signal one by one to the sigma-delta modulator 259. The sigma-delta modulator 259 performs sigma-delta conversion on the analog signals to obtain pulse density modulation signals and supplies the obtained pulse density modulation signals via the internal bus 224 to the CPU 211. The CPU 211 performs digital filtering on the pulse density modulation signals and thereby digitizes the voltage analog signal, the temperature analog signal, and the current analog signal. The CPU 211 also obtains the remaining battery power of a battery by totaling the amounts of charge-and-discharge currents of the battery. For example, the detected temperature is used for temperature correction.

The fuel gauge IC 200, the batteries 301 and 302, the resistor 303 for electric current detection, a regulator-protection circuit 304, a resistor 305, and a switch 306 are housed in a case 310 and thereby form a battery pack 300. A terminal 311 of the battery pack 300 is connected to the positive terminal of the battery 301 and a power input terminal of the regulator-protection circuit 304. A power output terminal of the regulator-protection circuit 304 is connected to the port 235 of the fuel gauge IC 200 (the port 235 corresponds to the power supply terminal Tv2 of the digital circuit 122 shown in FIG. 1 and is supplied with the power-supply voltage Vdd). A terminal 312 is connected to a ground terminal of the regulator-protection circuit 304 via the resistor 305 and to a connecting point between the resistor 303 and the port 277 via the switch 306. The regulator-protection circuit 304 regulates the voltage between the terminals 311 and 312 and protects the fuel gauge IC 200 by opening the switch 306 when the voltage exceeds a predetermined level.

A port 236 of the fuel gauge IC 200 (the port 236 corresponds to the ground terminal Tgnd2 for the digital circuit 122 shown in FIG. 1 and is supplied with a ground potential Vss) is connected to the connecting point between the resistor 303 and the port 276. Terminals 313 and 314 of the battery pack 300 are connected to the ports 231 and 232 of the fuel gauge IC 200, respectively.

Figure 12:
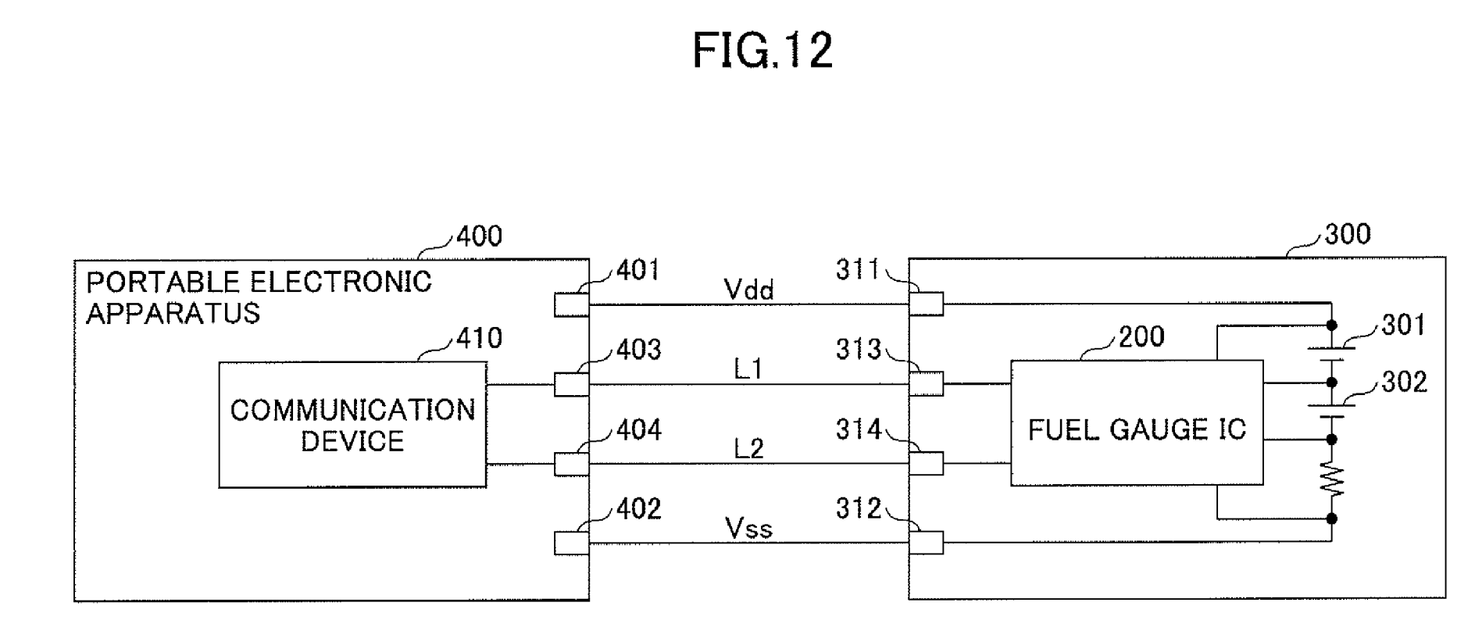
FIG. 12 is a block diagram illustrating an exemplary configuration of an exemplary portable electronic apparatus including the exemplary battery pack shown in FIG. 11 according to an embodiment of the present invention.

FIG. 12 is a block diagram illustrating an exemplary configuration of an exemplary portable electronic apparatus including the battery pack 300 shown in FIG. 11 according to an embodiment of the present invention. A portable electronic apparatus 400 shown in FIG. 12 may be a main circuitry of a portable personal computer, a digital still camera, or a mobile phone. The portable electronic apparatus 400 includes a CPU and an I2C unit having substantially the same configuration as that of the I2C unit 217 shown in FIG. 11.

The terminals 311 through 314 of the battery pack 300 are connected via a Vdd supply line, a Vss supply line, a clock line L1, and a data line L2 to terminals 401 through 404, respectively. The batteries 301 and 302 in the battery pack 300 supply an electric current to the portable electronic apparatus 400.

In the above configuration, the portable electronic apparatus 400 normally operates as a master and the fuel gauge IC 200 normally operates as a slave. In other words, when requested by the portable electronic apparatus 400, the fuel gauge IC 200 sends obtained remaining battery power to a communication device 410 of the portable electronic apparatus 400.

As described above, embodiments of the present invention provide a semiconductor integrated circuit device in which noise protection is performed without using an external component.

The present invention is not limited to the specifically disclosed embodiments, and variations and modifications may be made without departing from the scope of the present invention.

The present application is based on Japanese Priority Application No. 2006-037053 filed on Feb. 14, 2006, and Japanese Priority Application No. 2007-027930filed on Feb. 7, 2007, the entire contents of which are hereby incorporated herein by reference.

What is claimed is:

1. A semiconductor integrated circuit device, comprising:
a digital circuit and an analog circuit that are formed on one semiconductor substrate and supplied with a power-supply voltage from the same power supply;
a guard band formed on the semiconductor substrate in a position between the digital circuit and the analog circuit and configured to prevent noise generated in the digital circuit from being transmitted to the analog circuit;
a first power supply terminal positioned on a periphery of the semiconductor substrate near the analog circuit and configured to supply the power-supply voltage to the analog circuit;
a first ground terminal positioned on the periphery of the semiconductor substrate near the analog circuit and configured to supply a ground potential to the analog circuit;
a second power supply terminal positioned on the periphery of the semiconductor substrate near the digital circuit and configured to supply the power-supply voltage to the digital circuit;
a second ground terminal positioned on the periphery of the semiconductor substrate near the digital circuit and configured to supply the ground potential to the digital circuit; and
a filter circuit positioned between the second power supply terminal, the second ground terminal, and the digital circuit and configured to remove the noise transmitted from the digital circuit, the filter circuit being provided separately from the guard band and including
a first wiring pattern having a bent shape or a spiral shape and connecting the second power supply terminal and the digital circuit,
a second wiring having a bent shape or a spiral shape and connecting the second ground terminal and the digital circuit,
a first conductive pattern shaped like a flat rectangular plate and connected via through holes to the first wiring pattern, and
a second conductive pattern shaped like a flat rectangular plate and connected via through holes to the second wiring pattern, wherein the first conductive pattern and the second conductive pattern are stacked and an insulating layer is provided between them.

2. The semiconductor integrated circuit device as claimed in claim 1, wherein
the guard band includes a first diffusion region and a second diffusion region;
the first diffusion region is closer to the analog circuit than is the second diffusion region and the second diffusion region is closer to the digital circuit than is the first diffusion region;
the first diffusion region is connected to one of the first power supply terminal and the first ground terminal; and
the second diffusion region is connected to one of a power supply line and a ground line that connect the filter circuit and the digital circuit.

3. The semiconductor integrated circuit device as claimed in claim 1, wherein the through holes are formed in each of the first and second wiring patterns at regular intervals.

4. A semiconductor integrated circuit device, comprising:
a digital circuit and an analog circuit that are formed on one semiconductor substrate and supplied with a power-supply voltage from the same power supply;
a guard band formed on the semiconductor substrate in a position between the digital circuit and the analog circuit and configured to prevent noise generated in the digital circuit from being transmitted to the analog circuit;
a power supply terminal positioned on a periphery of the semiconductor substrate near the digital circuit and configured to supply the power-supply voltage to the digital circuit;
a ground terminal positioned on the periphery of the semiconductor substrate near the digital circuit and configured to supply a ground potential to the digital circuit;
a filter circuit positioned between the power supply terminal, the ground terminal, and the digital circuit and configured to remove the noise transmitted from the digital circuit, the filter circuit being provided separately from the guard band and including
a first wiring pattern having a bent shape or a spiral shape and connecting the power supply terminal and the digital circuit;
a second wiring having a bent shape or a spiral shape and connecting the ground terminal and the digital circuit;
a first conductive pattern shaped like a flat rectangular plate and connected via through holes to the first wiring pattern; and
a second conductive pattern shaped like a flat rectangular plate and connected via through holes to the second wiring pattern, wherein the first conductive pattern and the second conductive pattern are stacked and an insulating layer is provided between them;

a branched power supply line that branches off from a power supply line connecting the power supply terminal and the filter circuit and is configured to supply the power-supply voltage to the analog circuit; and a branched ground line that branches off from a ground line connecting the ground terminal and the fitter circuit and is configured to supply the ground potential to the analog circuit.

5. The semiconductor integrated circuit device as claimed in claim 4, wherein the guard band includes a first diffusion region and a second diffusion region;

the first diffusion region is closer to the analog circuit than is the second diffusion region and the second diffusion region is closer to the digital circuit than is the first diffusion region;

the first diffusion region is connected to one of the branched power supply line and the branched ground line; and the second diffusion region is connected to one of a power supply line and a ground line that connect the filter circuit and the digital circuit.

6. The semiconductor integrated circuit device as claimed in claim 4, wherein the through holes are formed in each of the first and second wiring patterns at regular intervals.

* * * * *